US012123932B2

(12) United States Patent
Tamada et al.

(10) Patent No.: US 12,123,932 B2
(45) Date of Patent: Oct. 22, 2024

(54) SYSTEM AND METHOD FOR QUANTITATIVE MAPPING WITH MAGNETIC RESONANCE IMAGING

(71) Applicant: Wisconsin Alumni Research Foundation, Madison, WI (US)

(72) Inventors: Daiki Tamada, Madison, WI (US); Scott B. Reeder, Middleton, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 854 days.

(21) Appl. No.: 17/221,280

(22) Filed: Apr. 2, 2021

(65) Prior Publication Data

US 2022/0326327 A1   Oct. 13, 2022

(51) Int. Cl.
*G01R 33/48* (2006.01)
*G01R 33/36* (2006.01)
*G01R 33/44* (2006.01)
*G01R 33/561* (2006.01)
*G01R 33/565* (2006.01)

(52) U.S. Cl.
CPC ..... *G01R 33/4828* (2013.01); *G01R 33/3621* (2013.01); *G01R 33/445* (2013.01); *G01R 33/5615* (2013.01); *G01R 33/56518* (2013.01); *G01R 33/56554* (2013.01)

(58) Field of Classification Search
CPC ............ G01R 33/4828; G01R 33/3621; G01R 33/445; G01R 33/5615; G01R 33/56518; G01R 33/56554
See application file for complete search history.

(56) References Cited

U.S. PATENT DOCUMENTS

| 10,845,466 | B2 | 11/2020 | Reeder et al. | |
|---|---|---|---|---|
| 2007/0152666 | A1* | 7/2007 | Thesen | G01N 24/08 324/306 |
| 2015/0160321 | A1* | 6/2015 | Patil | G01R 33/56563 324/309 |
| 2016/0084928 | A1* | 3/2016 | Ouyang | G01R 33/5605 324/309 |
| 2016/0313423 | A1* | 10/2016 | Eggers | G01R 33/56563 |
| 2018/0088197 | A1* | 3/2018 | Suh | G01R 33/5608 |
| 2018/0136300 | A1* | 5/2018 | De Rochefort | G01R 33/54 |

(Continued)

OTHER PUBLICATIONS

Brittain JH, Hu BS, Wright GA, Meyer CH, Macovski A, Nishimura DG. Coronary angiography with magnetization-prepared T2 contrast. Magnetic resonance in medicine 1995;33(5):689-696.

(Continued)

*Primary Examiner* — Sean A Frith
(74) *Attorney, Agent, or Firm* — Quarles & Brady, LLP

(57) ABSTRACT

A system and method are provided for producing at least one of an image or a map of a subject includes controlling a magnetic resonance imaging (MRI) system to perform a pulse sequence that includes a phase increment of an RF pulse selected to induce a phase difference between two echoes at different echo times (TE). The method also includes controlling the MRI system to acquire MR data corresponding to at least the two echoes at different TEs, deriving a static magnetic field (B0) map of the MRI system using the MR data corresponding to the two echoes, and using the B0 map and MR data from at least one of the two echoes, generate a map of T2 of the subject.

20 Claims, 8 Drawing Sheets

(56) References Cited

U.S. PATENT DOCUMENTS

| | | | | |
|---|---|---|---|---|
| 2018/0292488 | A1* | 10/2018 | Moeller | G01R 33/5616 |
| 2019/0212407 | A1* | 7/2019 | Köhler | G01R 33/56518 |
| 2019/0242961 | A1* | 8/2019 | Meineke | G01R 33/443 |
| 2020/0249299 | A1* | 8/2020 | Botnar | G06T 7/0012 |
| 2020/0278406 | A1* | 9/2020 | Sharma | G01R 33/4828 |
| 2020/0348382 | A1* | 11/2020 | Keupp | A61B 5/055 |

OTHER PUBLICATIONS

Crawley AP, Wood ML, Henkelman RM. Elimination of transverse coherences in FLASH MRI. Magnetic resonance in medicine 1988;8(3):248-260.

Deoni SC, Rutt BK, Peters TM. Rapid combined T1 and T2 mapping using gradient recalled acquisition in the steady state. Magnetic Resonance in Medicine: An Official Journal of the International Society for Magnetic Resonance in Medicine 2003;49(3):515-526.

Dregely I, Margolis DA, Sung K, Zhou Z, Rangwala N, Raman SS, Wu HH. Rapid quantitative T2 mapping of the prostate using three-dimensional dual echo steady state MRI at 3T. Magnetic Resonance in Medicine 2016;76(6):1720-1729.

Hennig J. Echoes—how to generate, recognize, use or avoid them in MR-imaging sequences. Part II: Echoes in imaging sequences. Concepts in Magnetic Resonance 1991;3(4):179-192.

Huang TY, Liu YJ, Stemmer A, Poncelet BP. T2 measurement of the human myocardium using a T2-prepared transient-state TrueFISP sequence. Magnetic Resonance in Medicine: An Official Journal of the International Society for Magnetic Resonance in Medicine 2007;57(5):960-966.

Reeder SB, Wen Z, Yu H, Pineda AR, Gold GE, Markl M, Pelc NJ. Multicoil Dixon chemical species separation with an iterative least-squares estimation method. Magnetic Resonance in Medicine: An Official Journal of the International Society for Magnetic Resonance in Medicine 2004;51(1):35-45.

Sobol WT, Gauntt DM. On the stationary states in gradient echo imaging. Journal of Magnetic Resonance Imaging 1996;6(2):384-398.

Sveinsson B, Chaudhari A, Gold G, Hargreaves B. A simple analytic method for estimating T2 in the knee from DESS. Magnetic resonance imaging 2017;38:63-70.

Wang X, Hernando D, Reeder SB. Phase-based T2 mapping with gradient echo imaging. Magnetic Resonance in Medicine 2019.

Yarnykh VL. Optimal radiofrequency and gradient spoiling for improved accuracy of T1 and B1 measurements using fast steady-state techniques. Magnetic Resonance in Medicine: An Official Journal of the International Society for Magnetic Resonance in Medicine 2010;63(6):1610-1626.

Yu H, Shimakawa A, McKenzie CA, Brodskky E, Brittain JH, Reeder SB, "Multiecho water-fat separation and simultaneous R2* estimation with multifrequency fat spectrum modeling", Magnetic Resonance in Medicine: Offical Journal of the Society of Magnetic Resonance in Medicine/Society of Magnetic Resonance in Medicine 2008; 60(5):1122-1134.

Zur Y, Wood M, Neuringer L. Spoiling of transverse magnetization in steady-state sequences. Magnetic resonance in medicine 1991;21(2):251-263.

* cited by examiner

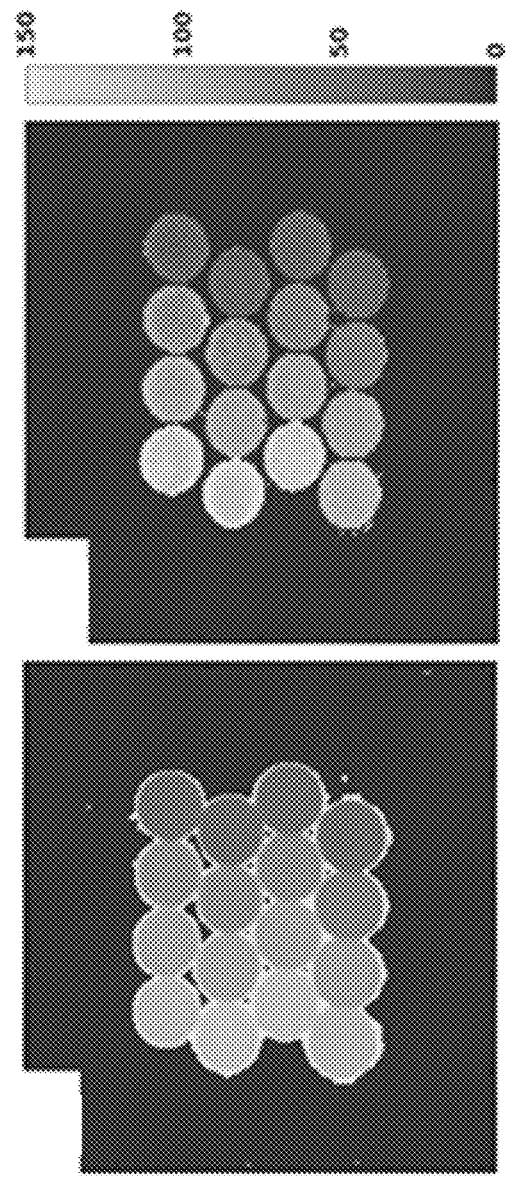
FIG. 6A
FIG. 6B
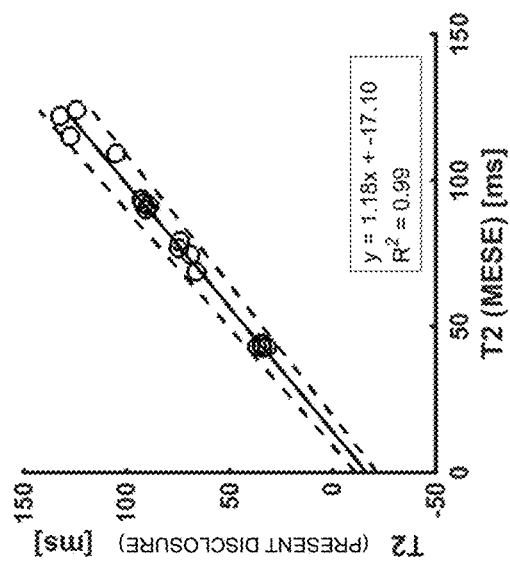
FIG. 6C

SYSTEM AND METHOD FOR QUANTITATIVE MAPPING WITH MAGNETIC RESONANCE IMAGING

STATEMENT REGARDING FEDERALLY SPONSORED RESEARCH

N/A

BACKGROUND

The field of the disclosure is systems and methods for magnetic resonance imaging (MRI). More particularly, the invention relates to systems and methods for magnetic resonance imaging to produce quantitative maps.

When a substance, such as human tissue, is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment, $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

To do so, the signals are often weighted in different ways to give preference to or consider different sub-signals or so-called contrast mechanisms. Two basic "contrast mechanisms" commonly utilized in MR imaging are the spin-lattice (or longitudinal or T1) relaxation time or spin-spin (or transverse or T2) relaxation time. The T1 and T2 contrast mechanism are the two most important relaxation mechanisms commonly exploited to provide soft tissue contrast in clinical MRI examinations. Both T1- and T2-weighted (T1w, T2w) acquisitions play a ubiquitous role in almost every clinical MRI exam and are important for a variety of applications including lesion detection, characterization, treatment monitoring, and many other applications. However, there are a variety of other mechanisms for eliciting contrast in MRI, including R2*. Specifically, T2* is a quantity related to T2, but including dephasing effects. That is, T2* is a quantity related to spin-spin relaxation and, in addition, relating magnetic field inhomogeneities and susceptibility effects.

These contrast mechanisms can be manipulated by selecting particular imaging parameters utilized while performing a pulse sequence to acquire MR data, so that the images reconstructed form the MR data reflect a particular weighting toward the preferred contrast mechanism that best illustrate the underlying anatomy or pathology that is the focus of the clinical analysis. Since the fundamentals of the pulse sequence and the imaging parameters dictate the contrast weighting, a variety of different pulse sequences and variations on pulse sequences have been developed.

Beyond controlling these contrast mechanisms for purposes of creating anatomical images, which convey qualitative information about the illustrated anatomical structures via the relative contrast in the images, there have been concerted efforts to elicit quantitative information from MR data. For example, instead of qualitative images, some have created quantitative maps using MR data. For example, quantitative T2 mapping has gained attention as a promising approach for the diagnosis and evaluation of various diseases. The so-called Carr-Purcell-Meiboom-Gill sequence is the most commonly used approach for quantifying T2. Other approaches to T2 mapping include the use of T2-prep (Brittain J H, Hu B S, Wright G A, Meyer C H, Macovski A, Nishimura D G. Coronary angiography with magnetization-prepared T2 contrast. Magnetic resonance in medicine 1995; 33(5):689-696.) and balanced steady-state free precession (Huang T Y, Liu Y J, Stemmer A, Poncelet B P. T2 measurement of the human myocardium using a T2-prepared transient-state TrueFISP sequence. Magnetic Resonance in Medicine: An Official Journal of the International Society for Magnetic Resonance in Medicine 2007; 57(5): 960-966.).

Some studies have explored simultaneous T1, T2 and ADC mapping with methods including diffusion-weighted dual-echo steady state (DESS). However, these techniques face substantial limitations. For the DESS method, the signal from steady-state sequence is complicated to model, especially with diffusion encoding, which may result in inaccuracy and large variance in diffusion measurements. Recently, a phase-based T2 mapping method that encodes T2 information into phase of RF phase modulated gradient echo signal has been proposed and demonstrated (Wang X, Hernando D, Reeder S B. Phase-based T2 mapping with gradient echo imaging. Magnetic Resonance in Medicine 2019 and U.S. Pat. No. 10,845,446, both of which are incorporated herein by reference).

Unfortunately, despite the ability to perform T2 mapping using these techniques, each techniques includes appreciable drawbacks. For example, these techniques require extended acquisition times, which increase the risk of motion artifacts or other challenges in data acquisition.

Thus, there is a continuing need for new MRI data acquisition, data processing, and/or image reconstruction techniques, for generating quantitative maps from MR data.

SUMMARY

The present disclosure overcomes the aforementioned drawbacks by providing systems and methods for performing quantitative mapping using a phase-based approach. For example, RF phase modulation can be used to elicit MR data suitable for quantitative mapping. The systems and methods provided herein are more efficient and less prone to artifacts or errors, such as caused by misregistration of acquisitions.

In accordance with one aspect of the disclosure, a magnetic resonance imaging (MRI) system is provided that includes a magnet system configured to generate a polarizing magnetic field about at least a portion of a subject arranged in the MRI system and a plurality of gradient coils configured to apply magnetic gradients to the polarizing magnetic field. The MRI system further includes a radio frequency (RF) system configured to apply an excitation field to the subject and acquire MR image data from the subject and a computer system. The computer system is programmed to control the plurality of gradient coils and the RF system to perform a gradient echo pulse sequence that includes a phase increment of an RF pulse of the gradient echo pulse sequence selected to induce a phase difference between two echoes selected to be similar, other than echo time (TE). The computer system is also configured to control the RF system to acquire MR data corresponding to at least the two echoes selected to be similar, other than TE and derive a $B_0$ map using the MR data corresponding to the two echoes selected to be similar, other than TE. The computer system is further programmed to use the $B_0$ map and MR data from at least one of the two echoes selected to be similar, other than TE, generate a map of T2 of the subject.

In accordance with another aspect of the disclosure, a method is provided for producing at least one of an image or a map of a subject includes controlling a magnetic resonance imaging (MRI) system to perform a pulse sequence that includes a phase increment of an RF pulse selected to induce a phase difference between two echoes at different echo times (TE). The method also includes controlling the MRI system to acquire MR data corresponding to at least the two echoes at different TEs, deriving a static magnetic field (B0) map of the MRI system using the MR data corresponding to the two echoes, and using the B0 map and MR data from at least one of the two echoes, generate a map of T2 of the subject.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 6A is an image of a phantom acquired using a multi-echo spin echo (MESE) acquisition.

FIG. 6B is an image of a phantom acquired using a process in accordance with the present disclosure.

FIG. 6C is a graph showing T2 mapped from the data corresponding to FIG. 6A against data corresponding to FIG. 6B.

DETAILED DESCRIPTION

When seeking to provide quantitative maps using MR data, some have used the magnitude signal from dual echo steady-state (DESS), and triple echo steady-state pulse sequences for rapid T2 mapping. Furthermore, a phase-based T2 mapping method that encodes T2 information into phase of RF phase modulated gradient echo signal has been proposed and demonstrated (Wang X, Hernando D, Reeder S B. Phase-based T2 mapping with gradient echo imaging. Magnetic Resonance in Medicine 2019 and U.S. Pat. No. 10,845,446, both of which are incorporated herein by reference). Despite rapid and reliable T2 mapping using the phase-based approach, two-pass imaging is required to subtract background phase. This doubles the acquisition time and can result in misregistration between the two separate acquisitions. Thus, as will be described, the present disclosures provides systems and methods for performing T2 mapping using a phase-based approach, whereby RF phase modulation is used, for example, with a pulse sequence such as the DESS or triple echo pulse sequences.

Figure 1:
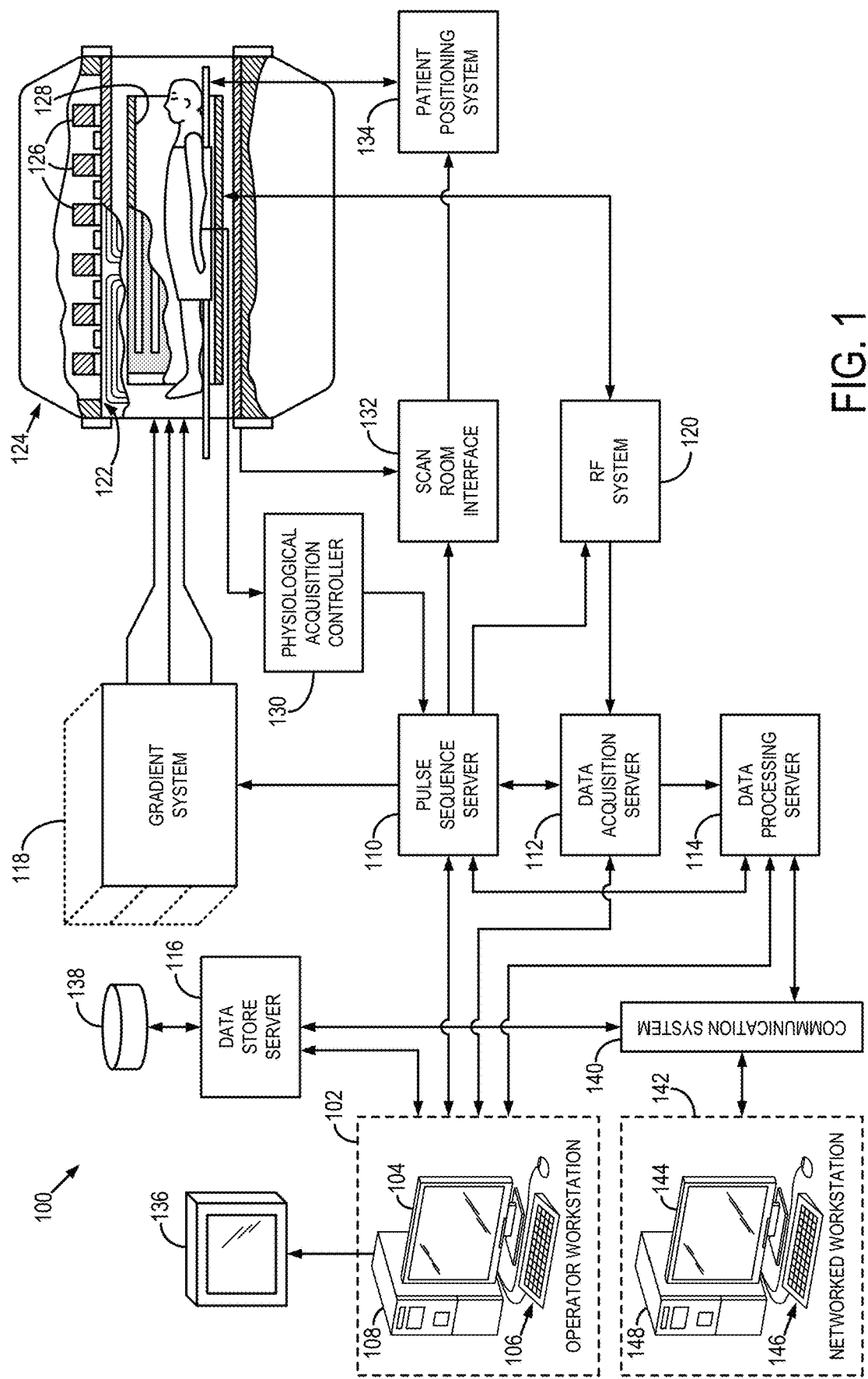
FIG. 1 is a block diagram of an exemplary magnetic resonance imaging (MRI) system configured in accordance with the present disclosure.

Referring now to FIG. 1, a magnetic resonance imaging (MRI) system 100 is provided that may be configured, programmed, or otherwise utilized in accordance with the present disclosure. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency (RF) system 120. Gradient waveforms to perform the prescribed scan are produced and applied to the gradient system 118, which excites gradient coils in an assembly 122 to produce the magnetic field gradients $G_x$, $G_y$, $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad \text{Eqn. 1;}$$

and the phase of the received magnetic resonance signal may also be determined according to the following relationship:

$$\varphi = \tan^{-1}\left(\frac{Q}{I}\right). \qquad \text{Eqn. 2}$$

The pulse sequence server 110 also optionally receives patient data from a physiological acquisition controller 130. By way of example, the physiological acquisition controller 130 may receive signals from a number of different sensors connected to the patient, such as electrocardiograph (ECG) signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data are lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data are acquired and used to calibrate the pulse sequence performed by the pulse sequence server 110. As another example, navigator signals may be acquired and used to adjust the operating parameters of the RF system 120 or the gradient system 118, or to control the view order in which k-space is sampled.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 112 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be processed remotely by a networked workstation 142. This data may be exchanged in any suitable format, such as in accordance with the transmission control protocol (TCP), the internet protocol (IP), or other known or suitable protocols.

Figure 2:
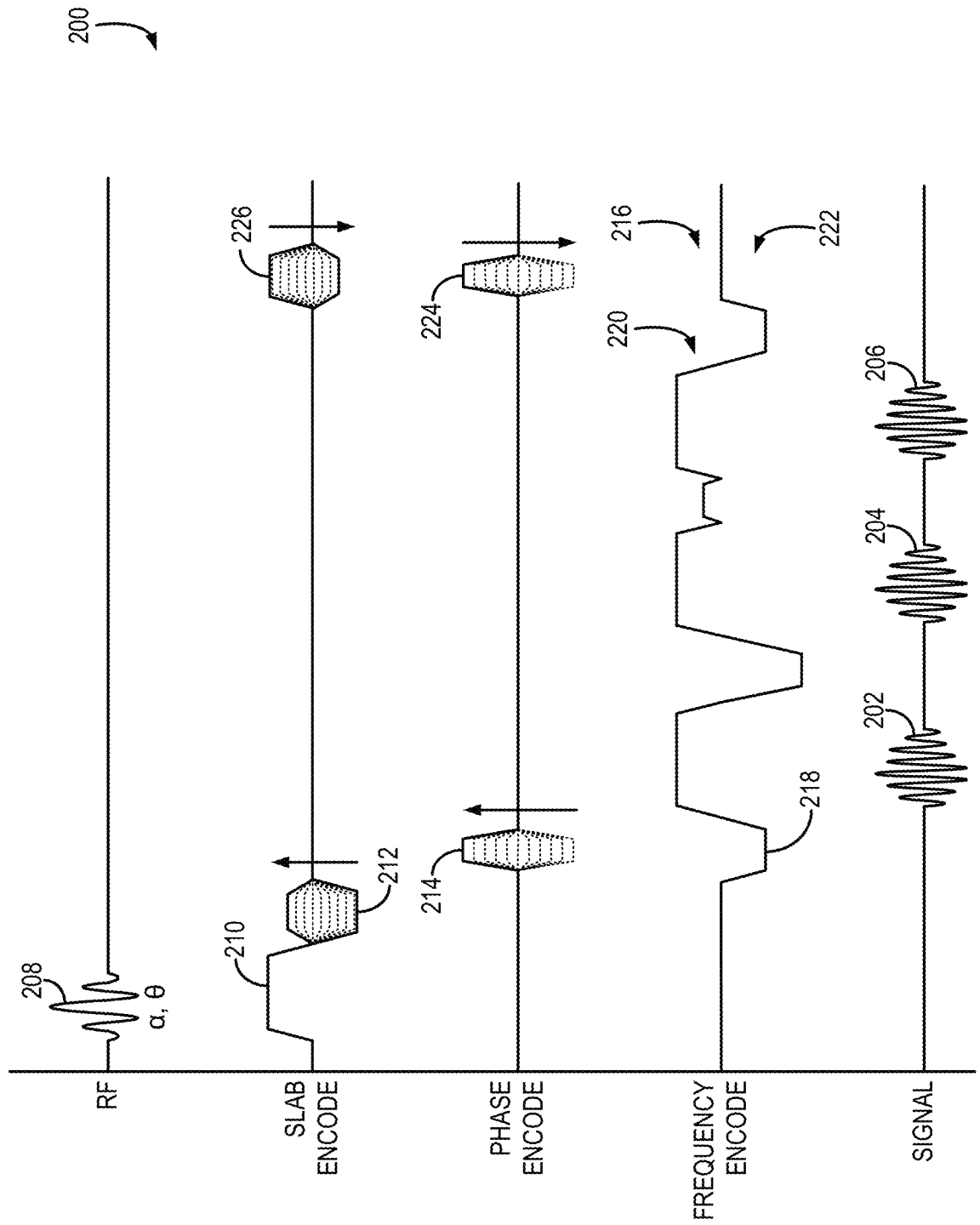
FIG. 2 is a graphic representation of an exemplary pulse sequence for directing the MRI system of FIG. 1 in accordance with the present disclosure.

The above-described MRI system can be used to implement a variety of pulse sequences to effectuate desired imaging studies. As will be described herein, one category of pulse sequence is the gradient echo (GRE) sequence and variations thereof, such as spoiled gradient echo (SGRE) acquisitions. Referring to FIG. 2, one non-limiting example of a pulse sequence 200 in accordance with the present disclosure is provided. In particular, the pulse sequence 200 of FIG. 2 is a three-echo pulse sequence because it is designed to elicit three echoes 202, 204, 206 as the MR signal. As will be explained, the first echo 202 and the second echo 204 are fast imaging with steady-state precession (FISP) or gradient-recalled acquisition in the steady state (GRASS) echoes. The third echo 206 is a time reversed fast imaging with steady state precession (PSIF) echo. In this regard, the pulse sequence 200 can be conceptualized as a variation of a dual echo steady state (DESS) pulse sequence because it is a combination of FISP and PSIF pulse sequences. As will be described, the pulse sequence 200 is a multi-echo T2-enhanced steady-state gradient echo sequence that, in accordance with the present disclosure, allows for a phase-based approach to T2 mapping.

In particular, the pulse sequence 200 includes a radio frequency (RF) pulse 208 that includes a phase increment. For example, the RF excitation pulse 208 may be performed with quadratic phase modulation of θ. A slab-selective gradient 210 with a slab-selective rewinder and slab encoding lobe 212 acts to rephase unwanted phase dispersions introduced by the slab-selective gradient 210, such that signal losses resultant from these phase dispersions are mitigated. Following excitation of the nuclear spins in the prescribed imaging slab, a phase encoding gradient 214 is applied to spatially encode the elicited echoes 202, 204, 206, along one direction in the prescribed imaging slab. In addition to phase encoding, a second encoding can be applied transversely, which may be referred to as "depth encoding." As a non-limiting example, if phase encoding is applied in the y-direction, depth encoding may be performed along the z-direction. A series of readout gradients 216 are also applied starting with a dephasing gradient lobe 218 to spatially encode the echoes 202, 204, 206 along a second, orthogonal direction in the prescribed imaging slab. More particularly, each acquisition includes of two FISP echoes 202, 203, that can be identified as "$S_1^{+}$" and "$S_2^{+}$". The second echo is followed by PSIF echo, which can be identified as "$S_1^{-}$". Thus, "$S_1^{+}$" and "$S_2^{+}$" can be conceptualized as the same signal sampled at different times, which, as will be described, allows the $B_0$ field to be derived without further acquisitions.

That is, the two FISP echoes 202, 204 have different echo times (TEs) and can be used to estimate a $B_0$ map. The $B_0$ map can then be used to demodulate $B_0$ phase components of the $S_1^{+}$ echo 202 and $S_1^{-}$ echo 206. The RF excitation 208 can be performed with a quadratic increase of transmitting phase to encode T2 information into the phase of the signal/echoes 202, 204, 206. Calibration acquisitions using positive readout gradients 220 and negative gradients 222 without phase-encoding can be incorporated to remove any eddy current-induced phase errors. Calibration acquisitions can be performed using two additional phase encoding lines 224 coupled with a spoiler and slab-encoding gradient rewinder gradient 226. Though illustrated with three echoes, more echoes could be acquired, including an $S_2^{-}$ echo, if desired, for example to facilitate fat and water separation. Furthermore, beyond performing water-fat separation, an estimate T2* can be derived from the echoes, such as described, for example, in Yu H, Shimakawa A, McKenzie C A, Brodsky E, Brittain J H, Reeder S B. Multiecho water-fat separation and simultaneous R2* estimation with multifrequency fat spectrum modeling. Magnetic resonance in medicine: official journal of the Society of Magnetic Resonance in Medicine/Society of Magnetic Resonance in Medicine 2008; 60(5):1122-1134, which is incorporated herein by reference.

In order to explain the characteristics and contrast of the steady-state of the above-described, RF phase modulated pulse sequence 200, one can use an approach such as described in Sobol W T, Gauntt D M. On the stationary states in gradient echo imaging. Journal of Magnetic Resonance Imaging 1996; 6(2):384-398, which is incorporated herein by reference, and which utilizes the configuration theory described in Hennig J. Echoes—how to generate, recognize, use or avoid them in MR-imaging sequences. Part II: Echoes in imaging sequences. Concepts in Magnetic Resonance 1991; 3(4):179-192 and also incorporated herein by reference.

As described, the pulse sequence 200 uses an RF pulse with flip angle (FA) of α, RF phase of ϕ, and repetition time (TR). RF phase modulation can be performed by incrementing the transmit RF phase (ϕ) quadratically. For example, incrementing can be achieved such that ϕ(n)=ϕ(n−1)+nθ, where θ is the RF phase increment. In this case, the steady-state complex signal (S) after RF excitation can be expressed as:

$$S^{+} = \beta(\eta X(-1) + j(\eta^2 - \epsilon (X(-1) - \epsilon))); \quad \text{Eqn. 3}$$

$$S^{-} = \beta(\eta + j(X(-1) - \epsilon)); \quad \text{Eqn. 4}$$

with $$\beta = \frac{\left(1 - e^{-\frac{TR}{T1}}\right) M_0 \sin\alpha}{\left(e^{-\frac{TR}{T2}} - \epsilon\right)\left[e^{-\frac{TR}{T2}}\left(\cos\alpha - e^{-\frac{TR}{T1}}\right) + \epsilon\left(1 - e^{-\frac{TR}{T1}}\cos\alpha\right)\right] - \eta^2\left(1 - e^{-\frac{TR}{T1}}\cos\alpha\right)}; \quad \text{Eqn. 5}$$

where $M_0$ is the proton density, and $\epsilon$ and $\eta$ are real coefficients defined as:

$$\epsilon = \text{Re}\left(\frac{\lambda - \Omega_{22}}{\Omega_{21}}\right); \quad \text{Eqn. 6}$$

$$\eta = \text{Im}\left(\frac{\lambda - \Omega_{22}}{\Omega_{21}}\right); \quad \text{Eqn. 7}$$

with $$\lambda = \frac{2}{\Omega_{11} + \Omega_{22} + \sqrt{(\Omega_{11} + \Omega_{22})^2 - 4}}; \quad \text{Eqn. 8}$$

where $\lambda$, $\epsilon$ and $\eta$ can be determined from the diagonal elements, $\Omega_{11}$ and $\Omega_{22}$, of the recursive matrix equation:

$$\begin{bmatrix} \Omega_{11} & \Omega_{21} \\ \Omega_{21} & \Omega_{22} \end{bmatrix} = \Psi_L \Psi_{L-1} \ldots \Psi_1, \quad \text{Eqn. 9;}$$

with the matrix $\Psi_l$ defined as:

$$\Psi_l = \frac{1}{(1 + \cos\alpha)\left(1 - e^{-\frac{TR}{T1}} e^{j\theta l}\right)} \cdot$$

$$\begin{bmatrix} 2e^{-\frac{TR}{T2}} \cdot \left(\cos\alpha - e^{-\frac{TR}{T1}} e^{j\theta l}\right) & (1 - \cos\alpha)\left(1 + e^{-\frac{TR}{T1}} e^{j\theta l}\right) \cdot e^{-j\theta l^2} \\ -(1 - \cos\alpha)\left(1 + e^{-\frac{TR}{T1}} e^{j\theta l}\right) e^{j\theta l^2} & 2e^{\frac{TR}{T2}}\left(1 - e^{-\frac{TR}{T1}}\cos\alpha \cdot e^{j\theta l}\right) \end{bmatrix}. \quad \text{Eqn. 10;}$$

where l=1, . . . , L, where L is an integer determined to satisfy the following condition:

$$\frac{\theta}{2} \cdot L = N \cdot \pi \, (N = 0, 1, 2, 3, \ldots). \quad \text{Eqn. 11;}$$

with N is the minimum integer number to satisfy Eqn. 11. For example, if θ=2°=π/90, the smallest value of N that satisfies Eqn. 11 is 1, and L=180. Importantly, the present disclosure recognizes that the phase difference, φ, between $S^{+}$ and $S^{-}$ is sensitive to T2.

Now the phase difference can be defined as:

$$\Delta = \arctan\left(\frac{s^{t}}{s^{-}}\right). \quad \text{Eqn. 12}$$

Figure 3:
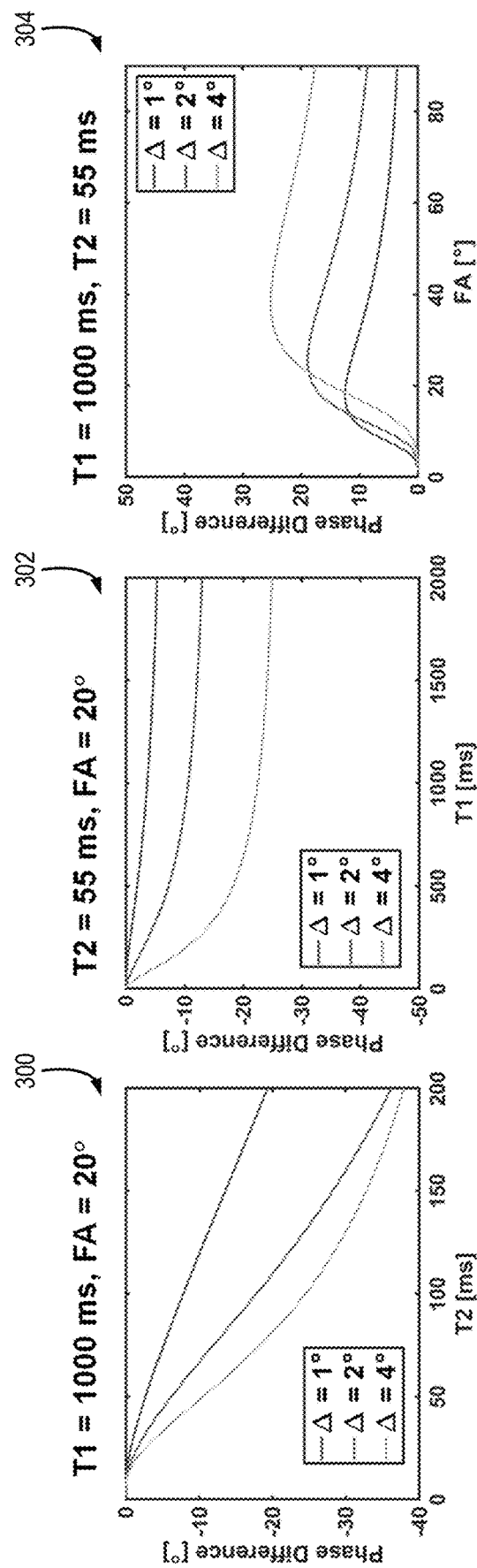
FIG. 3 is a set of correlated graphs showing phase difference plotted against T2, and T1, and FA.

To show the dependency of Δ on T1, T2, and FA, Δ with variable parameters was calculated using equations 3, 4, and 12. In particular, FIG. 3 includes a series of plots where the first plot 300 shows a phase difference with fixed T1 and FA, and variable T2. The phase decreases monotonically with small RF phase increment as T2 increases. As shown in the second plot 302 and third plot 304, Δ is less sensitive to T1 and FA. The equations and the calculation based on them reveals that T2 can be estimated from the phase difference. More particularly, the first plot 300 shows the phase difference plotted against T2, whereas the second plot shows the phase difference against T1, the third plot shows the phase difference against the FA. The phase was calculated using equations 3, 4, and 12 with small RF phase increments of 1, 2, and 4 degrees. Thus, the present disclosure recognizes and the plots show that the phase difference is sensitive to T2 over a wide range of T2, while the phase is relatively less sensitive to T1 and FA. With this recognition, the present invention provides efficient systems and methods for providing T2 maps using pulse sequences such as the one described above that utilize a phase increment.

With the MR data acquired such as described above, phase correction and reconstruction can be performed. Referring to FIG. 4, phase errors induced by eddy current of k-space can be corrected using calibration acquisitions consisting of positive and negative readouts. To remove the effect of eddy current, the phase of the acquired k-space is corrected along readout (RO) direction using calibration data. The $0^{th}$ and $1^{st}$ order of phase error components are estimated using non-linear optimization method.

In particular, in the three echo-DESS acquisition provided as an example above, RF excitation is performed with a quadratic phase modulation of θ, as described. As described and illustrated, the acquisitions include two FISP echoes ($S_1^+$ and $S_2^+$) followed by PSIF echo ($S_1^-$) with different TEs of $TE_1$, $TE_2$, $TE_3$ and calibration acquisitions can be incorporated into the acquisition. These echoes are modulated with B0– and eddy current-induced phase components. The echoes can be expressed as:

$$S_1^+ = S^+ e^{i(\psi TE_1 + \delta_1)}$$ Eqn. 13;

$$S_2^+ = S^+ e^{i(\psi TE_2 + \delta_2)}$$ Eqn. 14;

$$S_1^- = S^- e^{i(\psi TE_3 + \delta_3)}$$ Eqn. 15;

where ψ is off-resonance, and $\delta_1$-$\delta_3$ are the eddy current-induced phase errors for $S_1^+$, $S_2^+$, and $S_1^-$. Since gradient switching induces the $0^{th}$ and $1^{st}$ components of phase errors, $\delta_1$-$\delta_3$ can be expressed as:

$$\delta_1 = a_1 x + b_1$$ Eqn. 16;

$$\delta_2 = a_2 x + b_2$$ Eqn. 17;

$$\delta_3 = a_3 x + b_3$$ Eqn. 18;

where a and b are the constant coefficients, and x is the spatial coordinate along the readout gradient. When the polarity of the gradient is inverted, only the eddy current-induced phase is inverted.

Figure 4A:
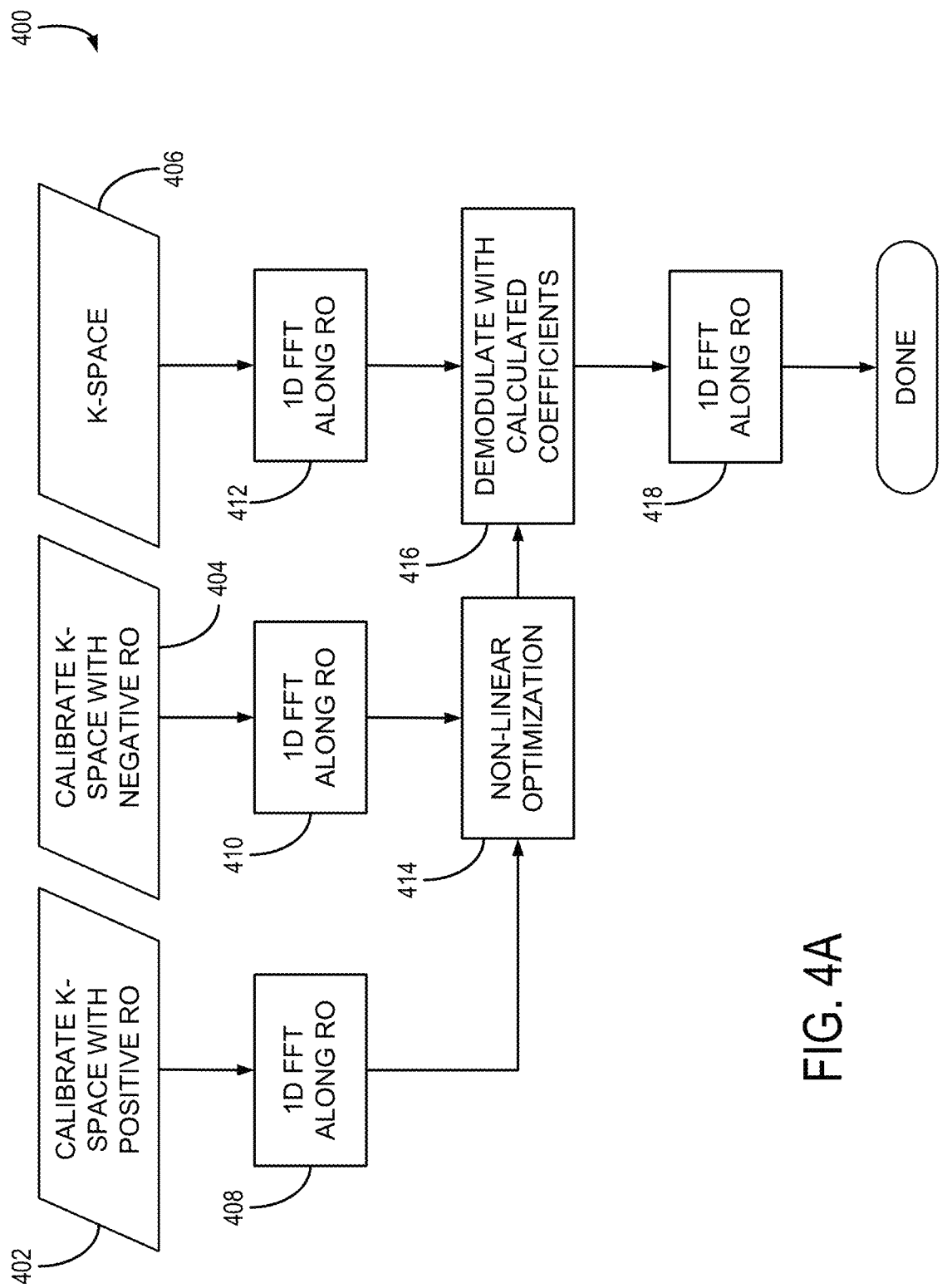
FIG. 4A is a flow chart setting forth some non-limiting examples steps of a process for correcting for eddy current induced phase.
Figure 4B:
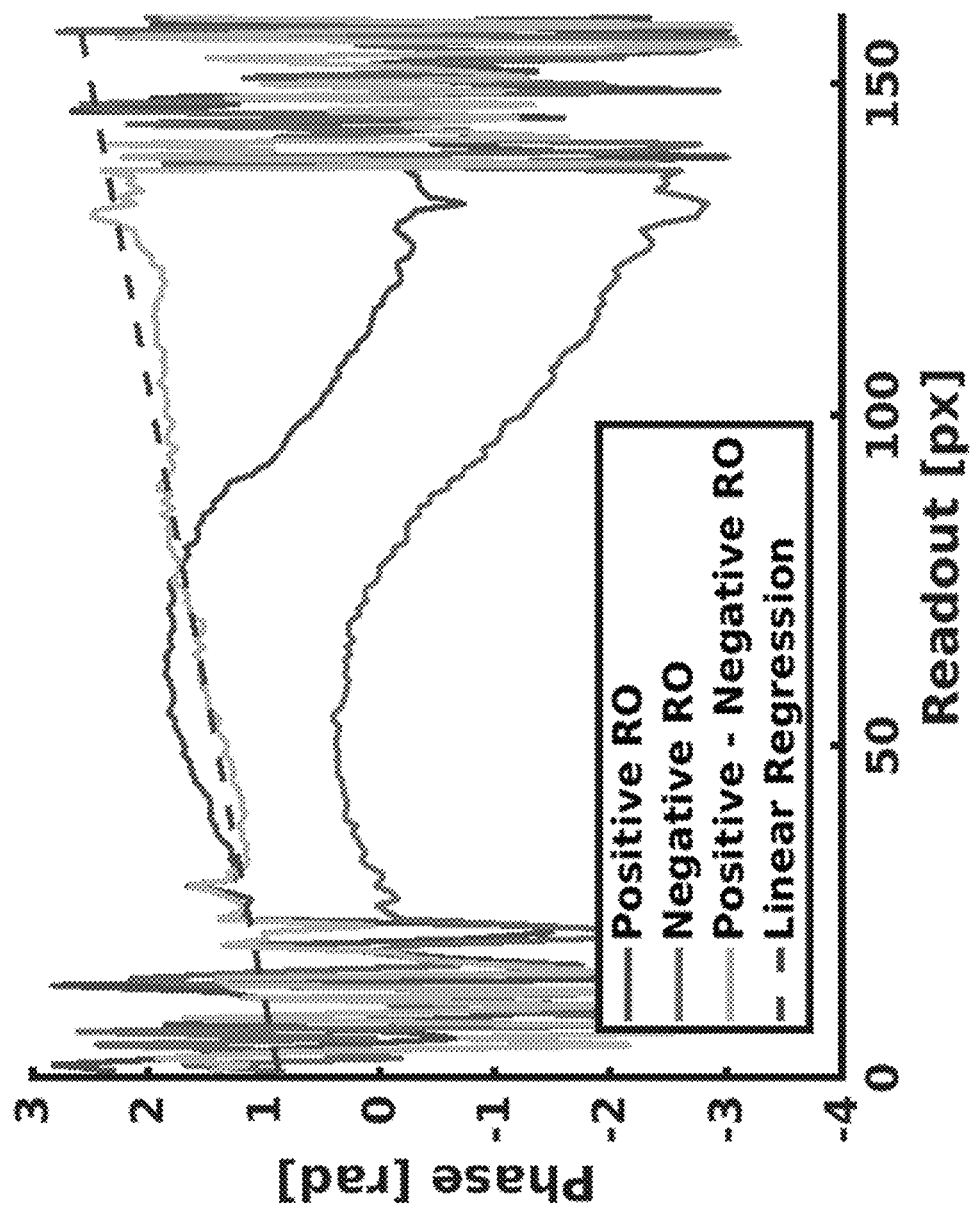
FIG. 4B is a graph showing coefficients of signal components of each echo can be determined by fitting the phase difference between signals with positive and negative readout since only the eddy current-induced phase depends on the polarity of the gradient.

Therefore, referring to FIG. 4A, the process 400 begins with inputs of the calibration of k-space with positive RO direction 402, calibration of k-space with negative RO direction 404, and unconstrained k-space 406. For each, a 1D fast Fourier transform (FFT) is performed along the RO direction 408, 410, 412. A non-linear optimization is then used at process block 414 to estimate the $0^{th}$ and $1^{st}$ order of phase error components. These coefficients can be determined by fitting the phase difference between signals with positive and negative readout gradients. For example, referring to FIG. 4B, a graph is provided that illustrates that the coefficients in Eqns. 16-18 can be determined by fitting the phase difference between signals with positive and negative readout since only the eddy current-induced phase depends on the polarity of the gradient.

Thus, at process block 416, the phase errors of $\delta_1$-$\delta_3$ can be corrected by demodulating the phase derived from the Eqns. 16-18 determined by the fitting and, at process block 418, a 1D FFT is performed.

Figure 5:
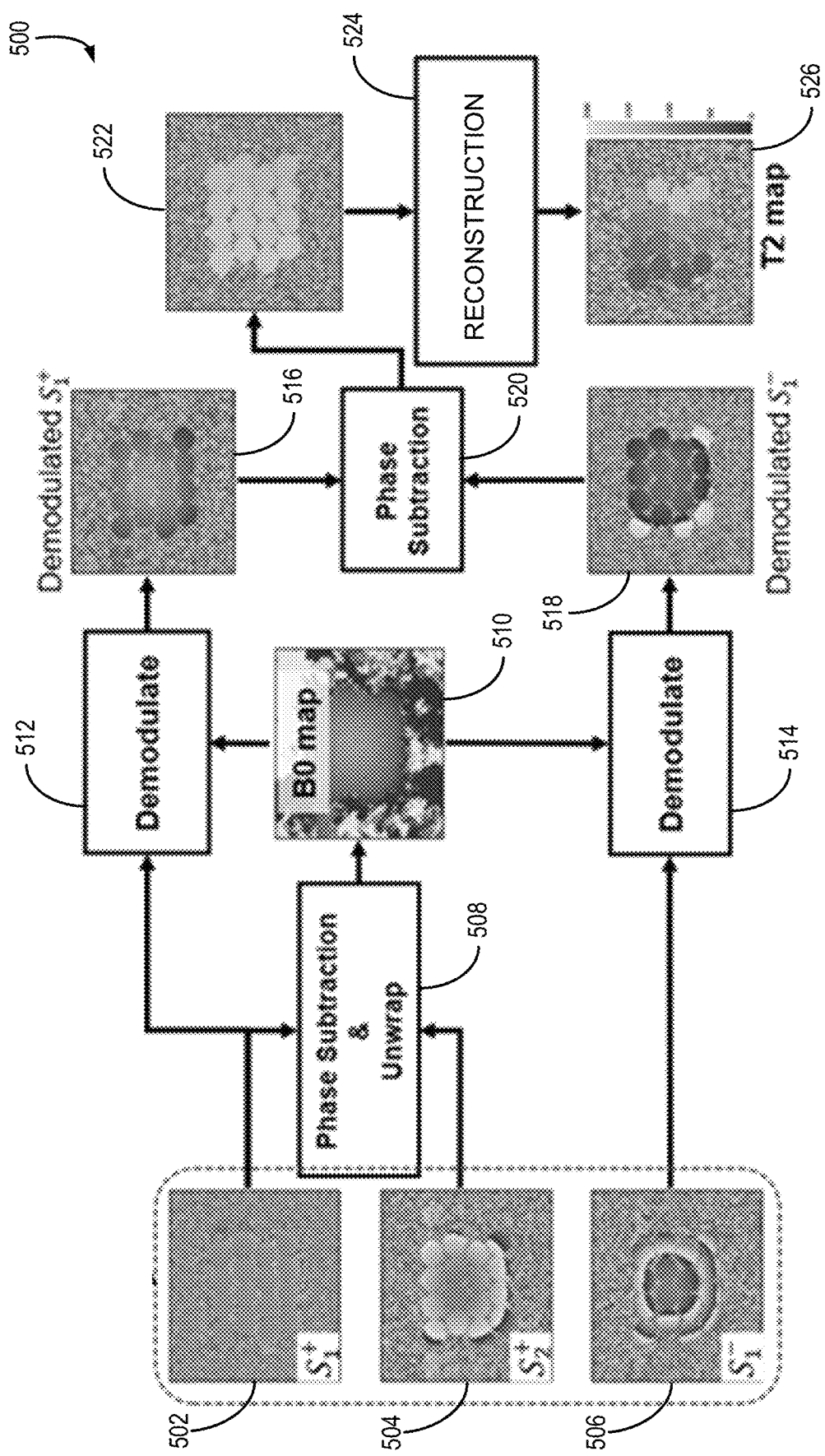
FIG. 5 is a flow chart setting forth some non-limiting examples steps of a process for a reconstruction strategy in accordance with one aspect of the present disclosure.

Referring to FIG. 5, a reconstruction process 500 in accordance with the present disclosure begins with the phase corrected images for the $S_1^+$ echo 502, $S_2^+$ echo 504, and the $S_1^-$ echo 506. That is, after correcting the eddy current-induced phase error, Eqns. 13-15 are simplified as:

$$S_1^+ = S^+ e^{i(\psi TE_1)}$$ Eqn. 19;

$$S_2^+ = S^+ e^{i(\psi TE_2)}$$ Eqn. 13;

$$S_1^- = S^- e^{i(\psi TE_3)}$$ Eqn. 13;

Since echo times are known, off-resonance ψ can be estimated by subtracting the phase between $S_1^+$ and $S_2^+$. The $S_1^+$ echo 502 and the $S_2^+$ echo 504 are used in a phase subtraction and unwrapping at process block 508. This can be used to yield a $B_0$ field map 510 and the $B_0$-induced phase error can removed by demodulating the phase using the estimated ψ at process block 512 and 514, which yields a demodulated $S_1^+$ 516 and demodulated $S_1^-$ 518. At process block 520 a subtraction is performed that yields a phase difference of $S_1^+$ and $S_1^-$, which can be used to reconstruct a T2 map 526 at process block 524. Alternatively, both the $S_1^+$ and $S_2^+$ may be used in the subtraction with $S_1^-$, which increases SNR. Furthermore, if additional echoes are acquired, those may also be used with $S_1^+$ and $S_2^+$. Regardless of the particular signals used, the reconstruction 524 can use a lookup table (LUT) for phase-based T2 estimation. The LUT can be calculated using equations 3-5. If desired, the LUT can use an assumption of T1, for example, an assumption of 1000 ms. The estimation of T2 can be performed by matching the phase difference of $S_1^+$ (and any additional signals) and $S_1^-$ 522 with the LUT.

EXAMPLE

Phantom and in vivo studies were performed using the systems and methods described above. T2 values of a phantom were measured using the multi-echo spin-echo (MESE) and the systems and methods described above. The phantom consisted of 16 vials and each vial was constructed with a varying concertation of $NiCl_2$ (0 mM, 0.5 mM, 1 mM, 2 mM) and Agar (0.5%, 1%, 2%, 4%) to modulate different T1 and T2. T2 mapping of the brain was also acquired. Healthy volunteers were recruited from an Institutional Review Board (IRB) approved database of healthy volunteers after signing informed written consent. Acquisition parameters are shown in Table 1.

TABLE 1

| | Phantom | Brain |
|---|---|---|
| (a) Parameters for MESE | | |
| TR | 1000 ms | 1000 ms |
| TEs | 7/14/22/29/37/ 44/51/59 ms | 7/14/22/29/37/ 44/51/59 ms |
| FOV | 20 × 20 | 20 × 20 |
| Bandwidth | 244 Hz/Pix | 244 Hz/Pix |
| Matrix Size | 256 × 160 | 256 × 160 |
| Number of Slices | 1 | 8 |
| Slice Thickness | 4 mm | 4 mm |

TABLE 1-continued

|  | Phantom | Brain |
|---|---|---|
| Scan Time | 2:44 | 2:44 |
| (b) Parameters for the proposed method | | |
| TR | 8.0 ms | 8.0 ms |
| TEs | 1.4/3.3.6/6.0 | 1.4/3.3.6/6.0 |
| FOV | 20 × 20 | 20 × 20 |
| Bandwidth | 488 Hz/Pix | 488 Hz/Pix |
| Flip Angle | 18° | 18° |
| Matrix Size | 160 × 160 × 24 | 160 × 160 × 24 |
| Slice Thickness | 4 mm | 4 mm |
| Scan Time | 0:33 | 0:33 |

T2 maps of the phantom measured using the systems and methods described herein are shown in FIG. 6A. T2 values agreed well ($R^2$=0.99) with those measured using MESE, although slight overestimation of the proposed method was observed, as shown in FIG. 6B. The slopes of the linear regression of the plot, as illustrated in FIG. 6C, were 1.18 (95% CI=1.12 to 1.24) and −17.1 (95% CI=−11.9 to −22.3).

Figure 7:
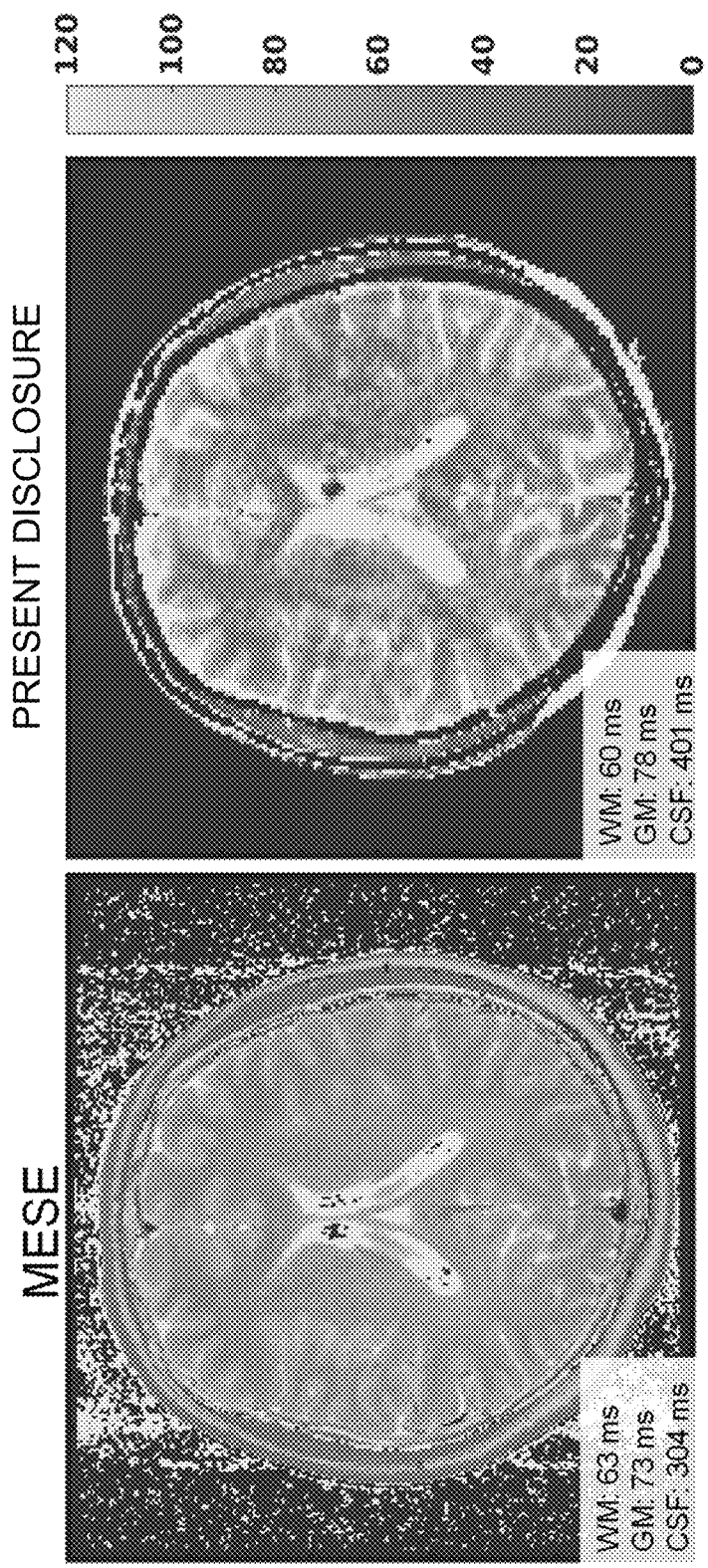
FIG. 7 is a set of images showing T2 maps for a volunteer brain measured using a MESE pulse sequence and a pulse sequence in accordance with the present disclosure.

Referring to FIG. 7, the T2 maps acquired of the brain using the MESE and proposed method are provided. T2 values of white matter, gray matter, and CSF estimated using the proposed method were 60 (±11), 78 (±9.7), and 401 (±186) ms, while those using MESE were 62 (±2.5), 73 (±2.8), and 354 (±70).

Thus, a new system and method was developed and demonstrated for T2 mapping using an RF phase-modulated acquisition strategy. T2 was estimated from the phase difference of FISP and PSIF signals using the lookup table approach. Phantom and in vivo studies demonstrate the feasibility of the proposed method to enable fast three-dimensional T2 mapping.

The systems and methods described herein can utilize a single acquisition, which enables faster T2 mapping without the potential for misregistration between two separate acquisitions, which is a substantial distinction from previously described T2 mapping methods that require the use of multiple acquisitions. Conventional DESS-based T2 enables T2 mapping with one acquisition. However, it utilizes magnitude information for an estimation, which may be biased by T2*. On the other hand, since the system and methods described herein provide a phase-based method, the results provided using the systems and methods described herein to not depend on T2*.

Thus, a new phase-based T2 mapping system and method are provided that can utilize a multi-echo steady-state pulse sequence. These systems and methods can be modified without deviating from the scope of the systems and methods described herein.

For example, so-called DIXON-based methods can be used for fat-water separation using multiple echoes acquired using the systems and methods described herein. For example, more than three echoes can be used to separate water and fat components and estimate T2 maps of water and fat.

As another example, water excitation can be performed to avoid fat signal. For example, a fat suppression pulse (chem-sat pulse) may affect the steady-state of underlying DESS pulse sequence. Thus, a water only excitation pulse can be used instead of fat suppression methods.

Also, additional external calibration $B_0$ mapping can be performed to achieve the two echo-DESS sequence. In this case a $S_2^+$ echo is not required anymore, which results in shorter TR and reduced scan time.

Furthermore, simultaneous T1/T2 mapping can be performed by using multiple flip angles. In particular, multiple acquisitions can be performed with different flip angles to encode T1 information into the magnitude of the signal and use the above-described phase-based method to generate the T2 map.

Further still, diffusion information can be encoded in the acquired data by increasing gradient moment. A spoiling gradient can be used to induce diffusion, which results in both phase shifts and magnitude attenuation, the combination of which can be used to encode the apparent diffusion coefficient of the underlying tissue.

Finally, simultaneous T1/T2-weighted imaging can be performed. For example, the present disclosure recognizes the dependence of the signal phase and magnitude on T2 of the tissue, at low RF phase increments ($\Delta\phi$). For low $\Delta\phi$ (on the order of just a few degrees), there is a strong dependence of the measured phase on the T2 of the tissue. That is, the magnitude of the signal ($\eta$) shows moderate dependence on T2, weak dependence on flip angle for flip angles larger than 10°, and heavy dependence on T1. However, there are some special cases of particular larger increments greater than, for example, 1-5° that preserve the transverse magnetization, for example, 32.2°. Regardless of the particular value of the increment, the present disclosure recognizes that, when the increment is properly selected, the phase differences are elicited that can be advantageously utilized. The present disclosure can use phase increments to induce distinct results in amplitude versus phase and create systems and methods to improved clinical results by creating a pulse sequence where both T1w and T2w data can be acquired during the same GRE or SGRE pulse sequence, thereby, eliminating the need for multiple acquisitions, such as multiple FSE acquisitions or combinations of FSE and SGRE acquisitions, such as described in co-pending U.S. patent application Ser. No. 17/184,768, which is incorporated herein by reference in its entirety.

The systems and methods described herein find substantial and diverse clinical applications, including brain imaging, cardiac imaging (including transplant rejection), liver imaging (including to study inflammation and fibrosis in diffuse liver disease, and also liver iron overload), cartilage imaging, and applications where pathology is known to alter the T2 and T1 of the underlying tissue.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
   a magnet system configured to generate a static magnetic field ($B_0$) about at least a portion of a subject arranged in the MRI system;
   a plurality of gradient coils configured to apply magnetic gradients to the polarizing magnetic field;
   a radio frequency (RF) system configured to apply an excitation field to the subject and acquire MR image data from the subject;
   a computer system programmed to:
      control the plurality of gradient coils and the RF system to perform a gradient echo pulse sequence that includes a phase increment of an RF pulse of the gradient echo pulse sequence selected to induce a phase difference between two echoes selected to be similar, other than echo time (TE);

control the RF system to acquire MR data corresponding to at least the two echoes selected to be similar, other than TE;

derive a $B_0$ map using the MR data corresponding to the two echoes selected to be similar, other than TE; and use the $B_0$ map and MR data from at least one of the two echoes selected to be similar, other than TE, generate a map of T2 of the subject.

2. The MRI system of claim 1, wherein the computer is further programmed to control the plurality of gradient coils and the RF system to acquire MR data corresponding to a third echo at a third TE and wherein, to derive the $B_0$ map the computer system uses the MR data corresponding to a first of the two echoes selected to be similar, other than TE and the MR data corresponding to the third echo.

3. The MRI system of claim 2, wherein the MR data corresponding to the first of the two echoes is a fast imaging with steady-state precession (FISP) echo ($S_1^+$) and the third echo is a time reversed fast imaging with steady state precession (PSIF) echo ($S_1^-$).

4. The MRI system of claim 3, wherein the $B_0$ map is used to demodulate $B_0$ phase components of the $S_1^+$ echo and the $S_1^-$ echo to generate the map of T2.

5. The MRI system of claim 4, wherein the computer system is further configured to subtract demodulated MR data corresponding to the $S_1^+$ echo and the $S_1^-$ echo and compare a result of the subtraction to a look up table to generate the map of T2.

6. The MRI system of claim 3, wherein the second of the two echoes is a fast imaging with steady-state precession (FISP) echo ($S_2^+$).

7. The MRI system of claim 1, wherein the phase increment is formed using a quadratic increase of transmitting phase to encode T2 information into the phase of the at least two echoes.

8. The MRI system of claim 1, wherein the computer system is further configured to control the plurality of gradient coils to apply positive readout gradients and negative gradients as calibration acquisitions without phase-encoding to remove eddy current-induced phase error.

9. The MRI system of claim 8, wherein the computer system is further configured to perform the calibration acquisitions using two additional phase encoding lines coupled with a slab encoding gradient.

10. The MRI system of claim 1, wherein the computer system is further configured to control the RF system to acquire MR data corresponding to more than the at least the two echoes and perform a fat and water separation method.

11. A method for producing at least one of an image or a map of a subject comprising:

controlling a magnetic resonance imaging (MRI) system to perform a pulse sequence that includes a phase increment of an RF pulse selected to induce a phase difference between two echoes at different echo times (TE);

controlling the MRI system to acquire MR data corresponding to at least the two echoes at different TEs;

deriving a static magnetic field ($B_0$) map of the MRI system using the MR data corresponding to the two echoes; and using the $B_0$ map and MR data from at least one of the two echoes, generate a map of T2 of the subject.

12. The method of claim 11, further comprising acquiring MR data corresponding to a third echo at a third TE and wherein, deriving the $B_0$ map includes using the MR data corresponding to a first of the two echoes and the MR data corresponding to the third echo.

13. The method of claim 12, wherein the first echo is a fast imaging with steady-state precession (FISP) echo ($S_1^+$) and the third echo is a time reversed fast imaging with steady state precession (PSIF) echo ($S_1^-$).

14. The method of claim 13, further comprising demodulating $B_0$ phase components of the $S_1^+$ echo and the $S_1^-$ echo using the $B_0$ map to generate the map of T2.

15. The method of claim 14, further comprising subtracting demodulated MR data corresponding to the $S_1^+$ echo and the $S_1^-$ echo and comparing a result of subtracting demodulated MR data to a look up table to generate the map of T2.

16. The method of claim 13, wherein the second of the two echoes is a fast imaging with steady-state precession (FISP) echo ($S_2^+$).

17. The method of claim 11, wherein the phase increment is formed using a quadratic increase of transmitting phase to encode T2 information into the phase of the at least two echoes.

18. The method of claim 11, further comprising applying positive readout gradients and negative gradients as calibration acquisitions without phase-encoding to remove eddy current-induced phase errors.

19. The method of claim 18, further comprising performing the calibration acquisitions using two additional phase encoding lines coupled with a slab encoding gradient.

20. The method of claim 11, further comprising acquiring MR data corresponding to more than the at least the two echoes and performing a fat and water separation method.

* * * * *

UNITED STATES PATENT AND TRADEMARK OFFICE
CERTIFICATE OF CORRECTION

| | | |
|---|---|---|
| PATENT NO. | : 12,123,932 B2 | |
| APPLICATION NO. | : 17/221280 | |
| DATED | : October 22, 2024 | |
| INVENTOR(S) | : Daiki Tamada et al. | |

It is certified that error appears in the above-identified patent and that said Letters Patent is hereby corrected as shown below:

In the Specification

Column 10, Line 15, "$S_2^+ = S^+ e^{i(\psi TE_2)}$   Eqn. 13" should be --$S_2^+ = S^+ e^{i(\psi TE_2)}$   Eqn. 20;--.

Column 10, Line 17, "$S_1^- = S^- e^{i(\psi TE_3)}$   Eqn. 13" should be --$S_1^- = S^- e^{i(\psi TE_3)}$   Eqn. 21;--.

Signed and Sealed this
Tenth Day of December, 2024

*Katherine Kelly Vidal*
Katherine Kelly Vidal
*Director of the United States Patent and Trademark Office*